United States Patent
Kamigaichi

(10) Patent No.: US 9,865,614 B2
(45) Date of Patent: Jan. 9, 2018

(54) SEMICONDUCTOR DEVICE

(71) Applicant: Toshiba Memory Corporation, Minato-ku (JP)

(72) Inventor: Takeshi Kamigaichi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/828,621

(22) Filed: Aug. 18, 2015

(65) Prior Publication Data

US 2016/0268295 A1  Sep. 15, 2016

Related U.S. Application Data

(60) Provisional application No. 62/130,151, filed on Mar. 9, 2015.

(51) Int. Cl.
*H01L 27/115* (2017.01)
*H01L 29/792* (2006.01)
(Continued)

(52) U.S. Cl.
CPC .... *H01L 27/11582* (2013.01); *H01L 27/1157* (2013.01)

(58) Field of Classification Search
CPC ......... H01L 27/11521; H01L 27/11519; H01L 27/11568; H01L 27/11578; H01L 27/11556; H01L 27/108; H01L 27/10897; H01L 27/11; H01L 27/1116; H01L 21/28282; H01L 21/28518; H01L 21/28273; H01L 21/30604; H01L 21/31; H01L 21/3105; H01L 21/31111; H01L 21/31116; H01L 21/441; H01L 21/465; H01L 21/469; H01L 29/04; H01L 29/16; H01L 29/24; H01L 29/4234; H01L 29/42324; H01L 29/518; H01L 29/7513; H01L 29/889; H01L 29/66969;
(Continued)

(56) References Cited

U.S. PATENT DOCUMENTS 8,441,061 B2    5/2013  Nakao et al.
8,846,508 B1 *  9/2014  England ............ H01L 21/26526
                                              257/E21.135
(Continued)

FOREIGN PATENT DOCUMENTS

JP    2013-62325    4/2013

*Primary Examiner* — Natalia Gondarenko
(74) *Attorney, Agent, or Firm* — Oblon, McClelland, Maier & Neustadt, L.L.P.

(57) ABSTRACT

According to one embodiment, a semiconductor device includes a stacked body and a columnar portion. The stacked body includes a plurality of electrode layers stacked with an insulator between the electrode layers. The columnar portion includes a semiconductor body extending in the stacked body in a stacking direction of the stacked body, and a charge storage film provided between the semiconductor body and the electrode layers. The columnar portion includes a first portion with a first diameter, and a second portion with a second diameter smaller than the first diameter. The first portion has a higher concentration of an impurity than a concentration of the impurity of the second portion. The impurity contains at least one of boron, arsenic, and phosphorus.

18 Claims, 9 Drawing Sheets

(51) Int. Cl.
*H01L 27/11582* (2017.01)
*H01L 27/1157* (2017.01)
*H01L 21/336* (2006.01)

(58) Field of Classification Search
CPC ....... H01L 27/115–27/11597; H01L 27/11524; H01L 27/11529; H01L 27/112–27/11293; H01L 27/11563–27/11582; H01L 27/1157; H01L 21/47573; H01L 29/423–29/42352; H01L 29/66825–29/66833; H01L 2924/145–2924/1451; H01L 2924/1453; H01L 2924/1437; H01L 21/76877; H01L 29/788–29/7926; H01L 21/1116; H01L 23/528; H01L 29/167; H01L 29/78; H01L 29/1095; H01L 29/7395; H01L 29/086; H01L 29/408; H01L 29/0696; H01L 29/0634; H01L 29/402; H01L 29/42376; H01L 29/0619; H01L 29/40; H01L 29/06; H01L 29/10; H01L 29/08; H01L 29/7393; H01L 29/66712–29/66734; H01L 29/7802–29/7815; H01L 29/66666; H01L 29/7827–29/7828; H01L 29/78642; H01L 27/085–27/098; H01L 27/0922; H01L 27/105; H01L 27/11526; H01L 27/11546; H01L 21/8232–21/8239; H01L 21/823462; H01L 21/823842; H01L 21/823857; H01L 21/82348

USPC ..... 257/324, E21.09, E29.309; 438/488, 479
See application file for complete search history.

(56) References Cited

U.S. PATENT DOCUMENTS

| | | | |
|---|---|---|---|
| 8,916,926 B2* | 12/2014 | Choe | H01L 27/1157 257/324 |
| 2004/0238879 A1* | 12/2004 | Endoh | H01L 27/11556 257/315 |
| 2007/0252201 A1* | 11/2007 | Kito | H01L 21/8221 257/331 |
| 2010/0237402 A1 | 9/2010 | Sekine et al. | |
| 2012/0008400 A1* | 1/2012 | Fukuzumi | G11C 16/0483 365/185.18 |
| 2012/0156848 A1* | 6/2012 | Yang | H01L 27/11529 438/287 |
| 2012/0213009 A1* | 8/2012 | Aritome | G11C 16/0408 365/185.29 |
| 2013/0087845 A1 | 4/2013 | Yasuda | |
| 2013/0109158 A1* | 5/2013 | Lee | H01L 27/11582 438/488 |
| 2014/0024189 A1* | 1/2014 | Kim | H01L 29/66666 438/287 |
| 2015/0129954 A1* | 5/2015 | Kim | H01L 29/7926 257/328 |

* cited by examiner

SEMICONDUCTOR DEVICE

CROSS-REFERENCE TO RELATED APPLICATION

This application is based upon and claims the benefit of priority from U.S. Provisional Patent Application 62/130,151, filed on Mar. 9, 2015; the entire contents of which are incorporated herein by reference.

FIELD

Embodiments described herein relate generally to a semiconductor device.

BACKGROUND

A memory device having a three-dimensional structure is proposed. In the memory device, memory holes are formed in a stacked body including a plurality of electrode layers. A charge storage film and a semiconductor film are provided in the memory hole to extend in a stacking direction of the stacked body.

The memory hole is formed by, for example, anisotropic dry etching. As the aspect ratio of the memory hole increases, it becomes difficult to control the diameter of the memory hole so as to be uniform in the depth direction. The difference in the diameter of the memory hole may lead to a variation in the characteristics of memory cells.

DETAILED DESCRIPTION

Figure 1:
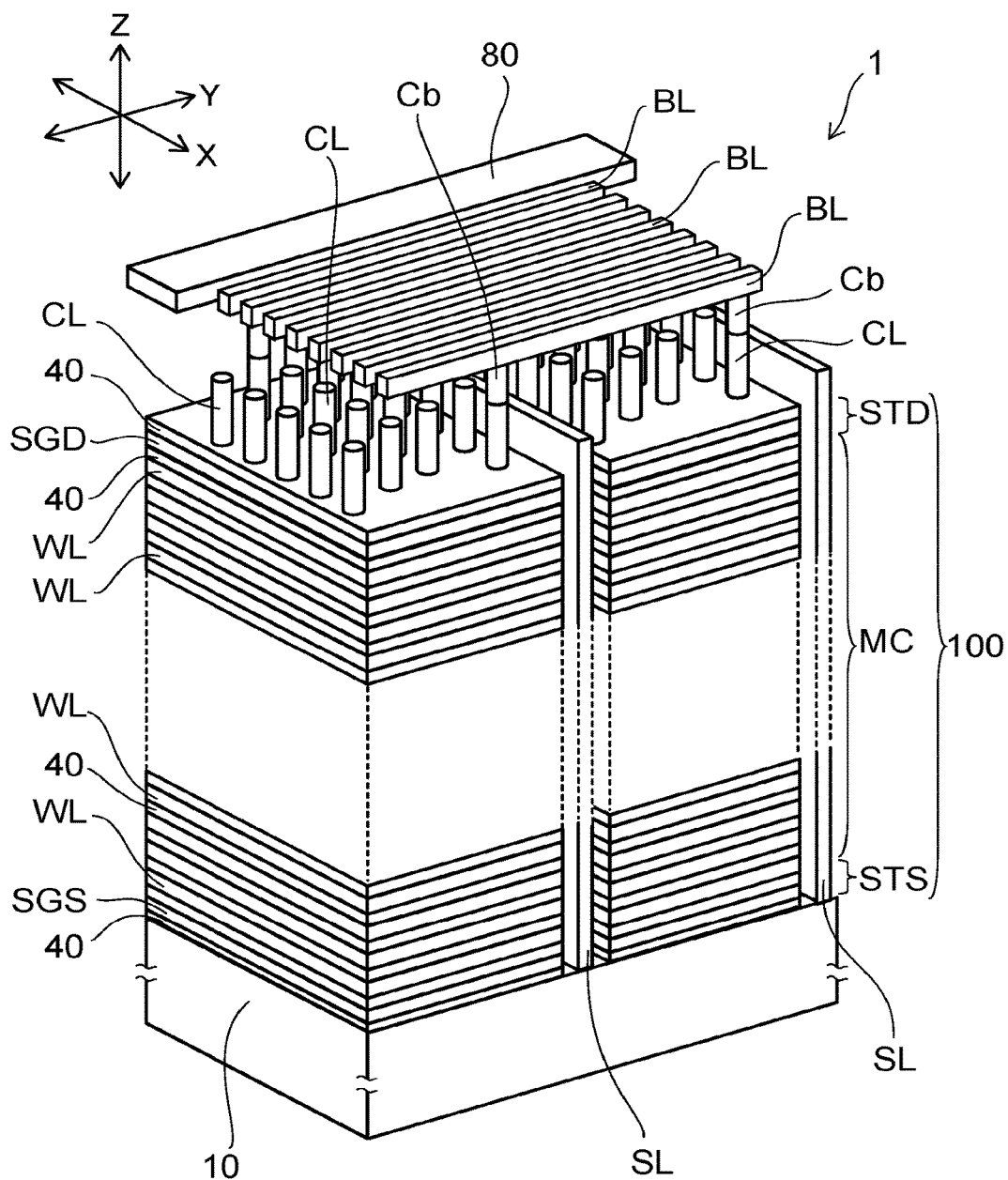
FIG. 1 is a schematic perspective view of a memory cell array of a semiconductor device of an embodiment.

According to one embodiment, a semiconductor device includes a stacked body and a columnar portion. The stacked body includes a plurality of electrode layers stacked with an insulator between the electrode layers. The columnar portion includes a semiconductor body extending in the stacked body in a stacking direction of the stacked body, and a charge storage film provided between the semiconductor body and the electrode layers. The columnar portion includes a first portion with a first diameter, and a second portion with a second diameter smaller than the first diameter. The first portion has a higher concentration of an impurity than a concentration of the impurity of the second portion. The impurity contains at least one of boron, arsenic, and phosphorus.

Hereinafter, embodiments will be described with reference to the drawings. In the drawings, the same elements are denoted by the same reference sign.

A semiconductor device of an embodiment is a semiconductor memory device including a memory cell array.

FIG. 1 is a schematic perspective view of a memory cell array 1 of the embodiment.

In FIG. 1, two directions parallel to a major surface of a substrate 10 and orthogonal to each other are defined as an X-direction (first direction) and a Y-direction (second direction), and a direction orthogonal to both the X-direction and the Y-direction is defined as a Z-direction (third direction or stacking direction).

The memory cell array 1 includes a stacked body 100 including a plurality of electrode layers WL, a drain-side select gate SGD, and a source-side select gate SGS, a plurality of columnar portions CL, and a plurality of separating portions ST.

The columnar portion CL is formed in a circular cylindrical or elliptical cylindrical shape extending in the stacking direction (the Z-direction) in the stacked body 100. The separating portion ST extends in the stacking direction (the Z-direction) and the X-direction in the stacked body 100, and separates the stacked body 100 into blocks in the Y-direction.

The source-side select gate (lower gate layer) SGS is provided on the substrate 10. The stacked body including the plurality of electrode layers WL is provided on the source-side select gate SGS. The drain-side select gate (upper gate layer) SGD is provided on the stacked body.

Figure 2:
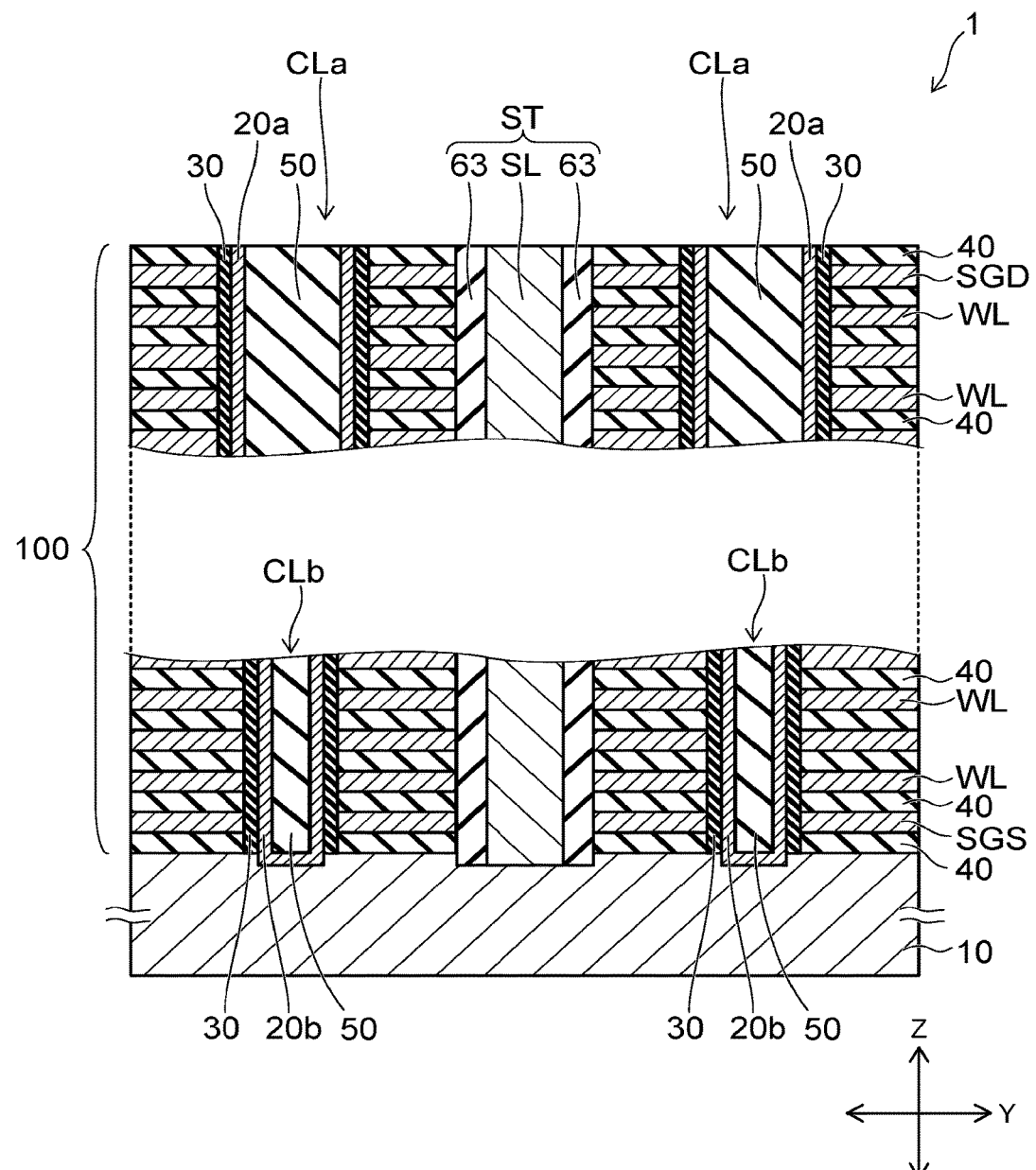
FIG. 2 is a schematic cross-sectional view of the memory cell array of the semiconductor device of the embodiment.

FIG. 2 is a schematic cross-sectional view of the memory cell array 1. FIG. 2 corresponds to a cross-section parallel to a Y-Z plane in FIG. 1. FIG. 2 shows extracted portions of the memory cell array 1 on the upper layer side and the lower layer side (the substrate 10 side).

The columnar portion CL includes a first portion CLa with a first diameter and a second portion CLb with a second diameter. The first portion CLa and the second portion CLb are continuously formed in the stacking direction (the Z-direction) of the stacked body 100.

The first portion CLa is provided on the upper side of the central portion in the stacking direction (the Z-direction) of the stacked body 100. The second portion CLb is provided on the lower side (the substrate 10 side) of the central portion in the stacking direction of the stacked body 100.

The diameter of the second portion CLb is smaller than the diameter of the first portion CLa. That is, the diameter of the columnar portion CL is smaller on the bottom side than on the top side.

The columnar portion CL is assumed to have a circular cylindrical shape in the embodiment. Actually, however, memory holes MH (shown in FIG. 5) in each of which the columnar portion CL is formed may not be truly circular but have an out-of-round shape (an ellipse, etc.) in many cases. In that case, the diameter of the columnar portion CL can be defined as an effective diameter obtained from a cross-sectional area taken along a plane (plane parallel to an X-Y plane) orthogonal to the extending direction (the Z-direction) of the columnar portion CL.

That is, from the relational expression of $S=\pi(R/2)^2$, where S is the cross-sectional area and R is the effective diameter of the columnar portion CL, the effective diameter R of the columnar portion CL commensurate with the cross-sectional area S can be obtained.

The source-side select gate SGS, the drain-side select gate SGD, and the electrode layers WL surround the columnar portion CL.

The source-side select gate SGS, the drain-side select gate SGD, and the electrode layer WL are metal layers. For example, the source-side select gate SGS, the drain-side select gate SGD, and the electrode layer WL contain tungsten or molybdenum as a main component. Alternatively, the source-side select gate SGS, the drain-side select gate SGD, and the electrode layer WL are silicon layers containing silicon as a main component, and the silicon layer is doped with, for example, boron as an impurity to provide conductivity. The silicon layer may contain metal silicide.

The source-side select gate SGS, the drain-side select gate SGD, and the electrode layers WL are stacked on the substrate 10 via insulators. The insulators are, for example, insulating layers 40, but may be air gaps. The insulating layer 40 is provided between the substrate 10 and the source-side select gate SGS. The insulating layer 40 is provided between the source-side select gate SGS and the electrode layer WL. The insulating layer 40 is provided between the electrode layers WL. The insulating layer 40 is provided between the electrode layer WL and the drain-side select gate SGD.

The insulating layer 40 is, for example, a silicon oxide film. Alternatively, a void may be included in the insulating layer 40.

In the example shown in FIG. 1, the plurality of columnar portions CL are disposed in a hound's-tooth check pattern. Alternatively, the plurality of columnar portions CL may be disposed in a square lattice arrangement along the X-direction and the Y-direction.

A plurality of bit lines (for example, metal films) BL are provided on the stacked body 100. The plurality of bit lines BL are separated from each other in the X-direction, and each of the bit lines BL extends in the Y-direction.

An upper end of the columnar portion CL is connected to the bit line BL via a contact portion Cb. The plurality of columnar portions CL, each of which is selected from each of areas (blocks) separated in the Y-direction by the separating portion ST, are connected to one common bit line BL.

As shown in FIG. 2, the first portion CLa of the columnar portion CL includes a memory film 30, a semiconductor body 20a, and a core insulating film 50. The second portion CLb of the columnar portion CL includes the memory film 30, a semiconductor body 20b, and the core insulating film 50.

The semiconductor body 20a and the semiconductor body 20b are silicon films continuously provided integrally, and as will be described later, the semiconductor body 20a and the semiconductor body 20b have different impurity concentrations.

In the specification, an impurity is an acceptor that supplies semiconductor with holes, or a donor that supplies semiconductor with free electrons, and represents one that can provide intrinsic semiconductor with conductivity. For example, the impurity includes at least one of boron, arsenic, and phosphorus.

The semiconductor bodies 20a and 20b and the memory film 30 extend in a pipe shape in the Z-direction in the stacked body 100. The memory film 30 is provided between the stacked body 100 and the semiconductor bodies 20a and 20b, and surrounds the semiconductor bodies 20a and 20b from the outer circumferential side. The core insulating film 50 is provided inside the semiconductor bodies 20a and 20b.

Figure 3:
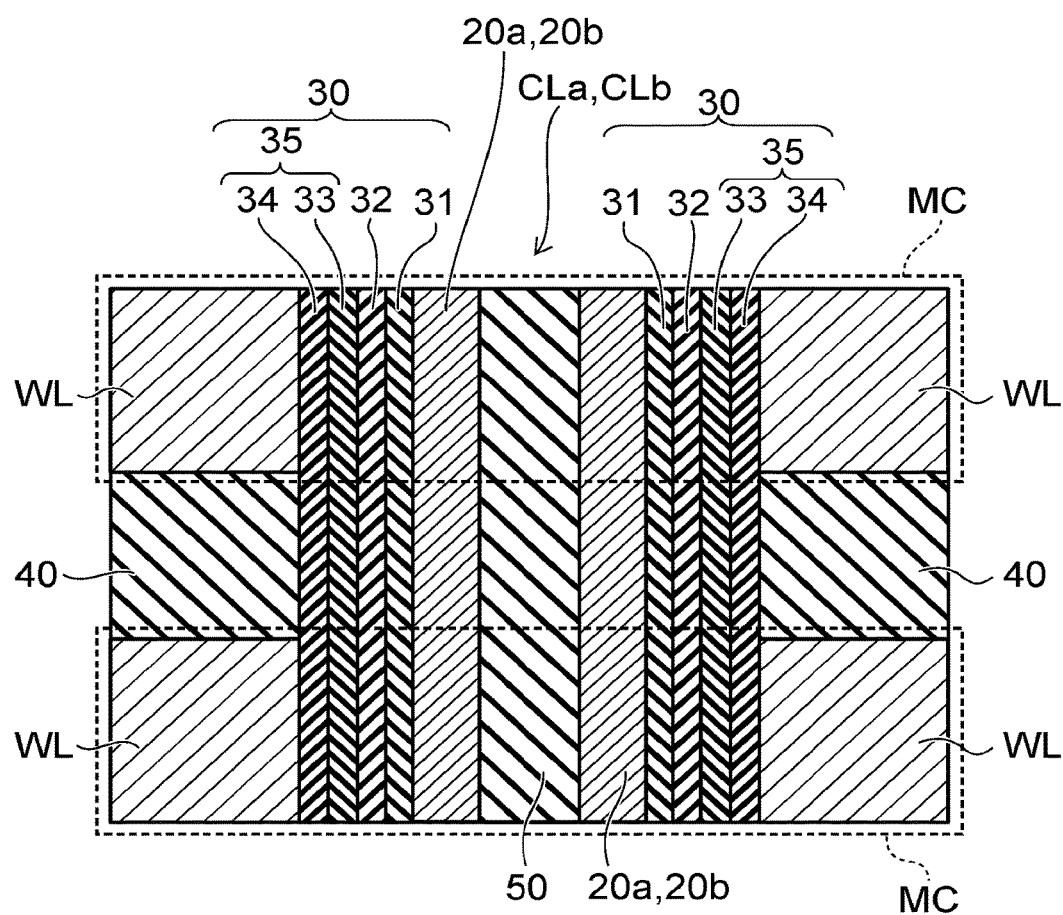
FIG. 3 is a schematic cross-sectional view of a columnar portion of the semiconductor device of the embodiment.

FIG. 3 is an enlarged schematic cross-sectional view of the first portion CLa or the second portion CLb of the columnar portion CL.

The memory film 30 includes a block insulating film (second insulating film) 35, a charge storage film 32, and a tunnel insulating film (first insulating film) 31. The block insulating film 35, the charge storage film 32, and the tunnel insulating film 31 are provided between the electrode layers WL and the semiconductor bodies 20a and 20b.

The block insulating film 35 is in contact with the electrode layer WL. The tunnel insulating film 31 is in contact with the semiconductor bodies 20a and 20b. The charge storage film 32 is provided between the block insulating film 35 and the tunnel insulating film 31.

In FIG. 3, for example, two memory cells MC are shown. The memory cell MC has a vertical transistor structure in which the electrode layer WL surrounds the semiconductor body 20a or 20b via the memory film 30.

Each of the semiconductor bodies 20a and 20b functions as a channel of the transistor (the memory cell MC), while the electrode layer WL functions as a control gate. The charge storage film 32 functions as a data storage layer that stores charge injected from the semiconductor body 20a or 20b.

The semiconductor memory device of the embodiment is a non-volatile semiconductor memory device that can electrically freely erase or write data, and can hold a memory content even if power is off.

The memory cell MC is, for example, a charge trap type memory cell. The charge storage film 32 has many trap sites to trap charge, and includes, for example, a silicon nitride film.

The tunnel insulating film 31 serves as a potential barrier when charge is injected from the semiconductor body 20a or 20b into the charge storage film 32 or when the charge stored in the charge storage film 32 diffuses into the semiconductor body 20a or 20b. The tunnel insulating film 31 includes, for example, a silicon oxide film. Alternatively, the tunnel insulating film 31 includes a stacked film (ONO film) having a structure in which a silicon nitride film is interposed between a pair of silicon oxide films. The tunnel insulating film 31 including the ONO film makes it possible to perform an erase operation at a low electric field, compared to a single layer of silicon oxide film.

The block insulating film 35 prevents the charge stored in the charge storage film 32 from diffusing into the electrode layer WL. The block insulating film 35 includes a cap film 34 provided in contact with the electrode layer WL, and a block film 33 provided between the cap film 34 and the charge storage film 32. The block film 33 is, for example, a silicon oxide film. The cap film 34 is a film having a higher dielectric constant than that of a silicon oxide film, and is, for example, a silicon nitride film, an aluminum oxide film, a hafnium oxide film, an yttrium oxide film, or the like. The cap film 34 in contact with the electrode layer WL may suppress back-tunneling electrons injected from the electrode layer WL in erasing.

As shown in FIG. 1, a drain-side select transistor STD is provided at an upper end portion of the columnar portion CL, and a source-side select transistor STS is provided at a lower end portion of the columnar portion CL.

The memory cell MC, the drain-side select transistor STD, and the source-side select transistor STS are vertical transistors in which a current flows in the stacking direction (the Z-direction) of the stacked body 100.

The drain-side select gate SGD functions as a gate electrode (control gate) of the drain-side select transistor STD. An insulating film that functions as a gate insulating film of the drain-side select transistor STD is provided between the drain-side select gate SGD and the semiconductor body 20a.

The source-side select gate SGS functions as a gate electrode (control gate) of the source-side select transistor STS. An insulating film that functions as a gate insulating film of the source-side select transistor STS is provided between the source-side select gate SGS and the semiconductor body 20*b*.

The plurality of memory cells MC having the respective electrode layers WL as control gates are provided between the drain-side select transistor STD and the source-side select transistor STS. The plurality of memory cells MC, the drain-side select transistor STD, and the source-side select transistor STS are connected in series through the semiconductor bodies 20*a* and 20*b* to configure one memory string. A plurality of the memory strings are arranged in the X-direction and the Y-direction, whereby the plurality of memory cells MC are three-dimensionally provided in the X-direction, the Y-direction, and the Z-direction.

Next, the separating portion ST will be described.

As shown in FIG. 2, the separating portion ST includes a source layer SL as a conductive layer, and an insulating film 63. The source layer SL is, for example, a metal layer containing tungsten or molybdenum as a main component. The source layer SL extends in the Z-direction, and also extends in the paper-surface depth-direction (corresponding to the X-direction in FIG. 1) in FIG. 2. The insulating film 63 is provided on both side walls of the source layer SL in the Y-direction. The insulating film 63 is provided between the source layer SL and the stacked body 100.

The separating portion ST spreads in a plate shape in the Z-direction and the X-direction, and separates the stacked body 100 into blocks in the Y-direction.

As shown in FIG. 2, a lower end of the semiconductor body 20*b* and a lower end of the source layer SL are in contact with the substrate 10. The lower end of the semiconductor body 20*b* is electrically connected with the source layer SL via the substrate 10. The source layer SL is connected with an upper layer interconnect layer 80, shown in FIG. 1, provided above the stacked body 100. An upper end of the semiconductor body 20*a* is connected with the bit line BL shown in FIG. 1.

The impurity concentration of the semiconductor body 20*a* of the first portion CLa of the columnar portion CL is higher than the impurity concentration of the semiconductor body 20*b* of the second portion CLb. The semiconductor body 20*a* of the first portion CLa contains, for example, boron as an impurity. The memory cell MC having the semiconductor body 20*a* as a channel has a p-type field effect transistor (FET) structure that allows the memory cell to be turned on when a positive potential is applied to the electrode layer WL as a control gate. The semiconductor body 20*b* of the second portion CLb is intrinsic semiconductor.

Next, a method for manufacturing the semiconductor memory device of the embodiment will be described with reference to FIG. 4 to FIG. 6.

Figure 4:
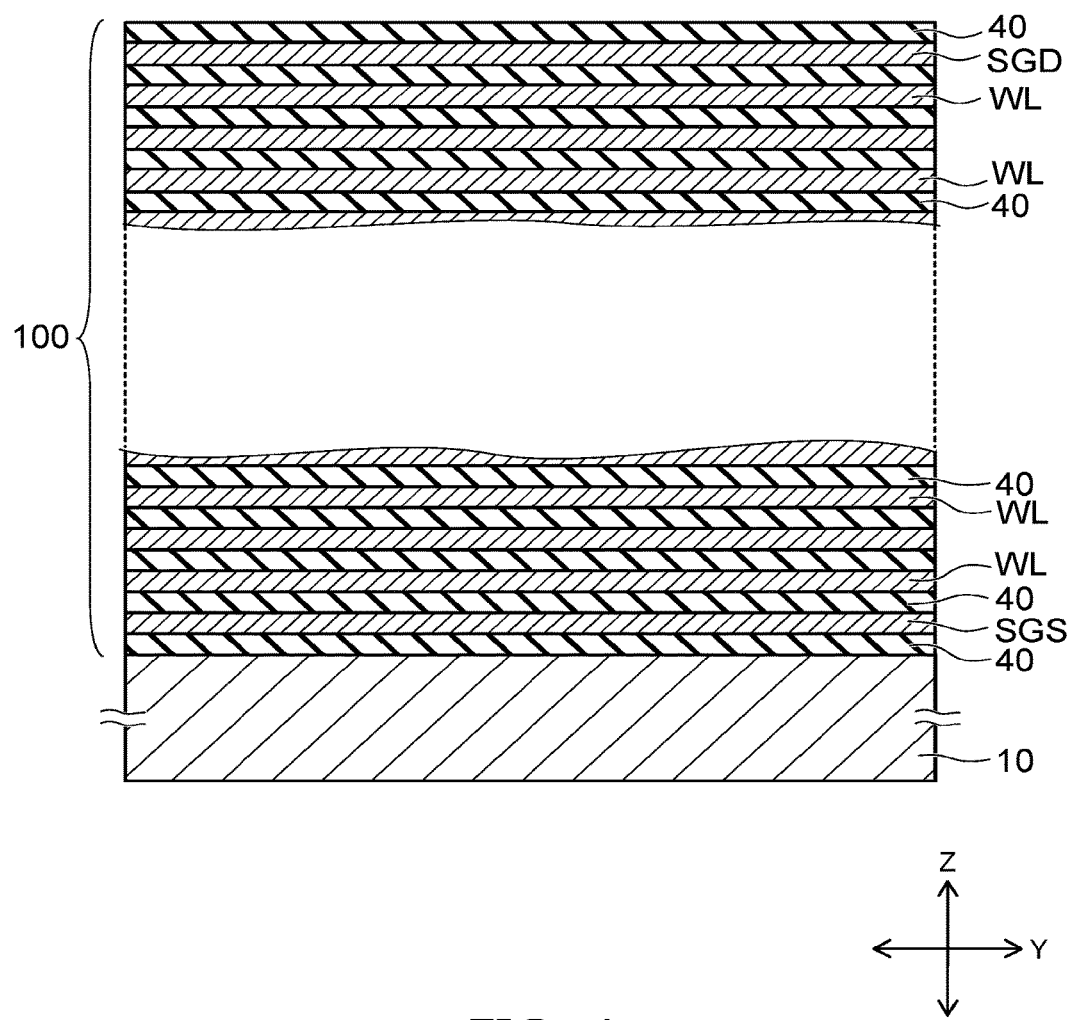
FIGS. 4 to 6 are schematic cross-sectional views showing a method for manufacturing the semiconductor device of the embodiment.

As shown in FIG. 4, first layers and second layers of a different kind of material from the first layer are alternately stacked on the substrate 10 to form the stacked body 100. The stacked body 100 includes the conductive layers (the select gates SGS and SGD and the plurality of electrode layers WL), and the plurality of insulating layers 40. The substrate 10 is, for example, a semiconductor substrate, and is a silicon substrate.

Figure 5:
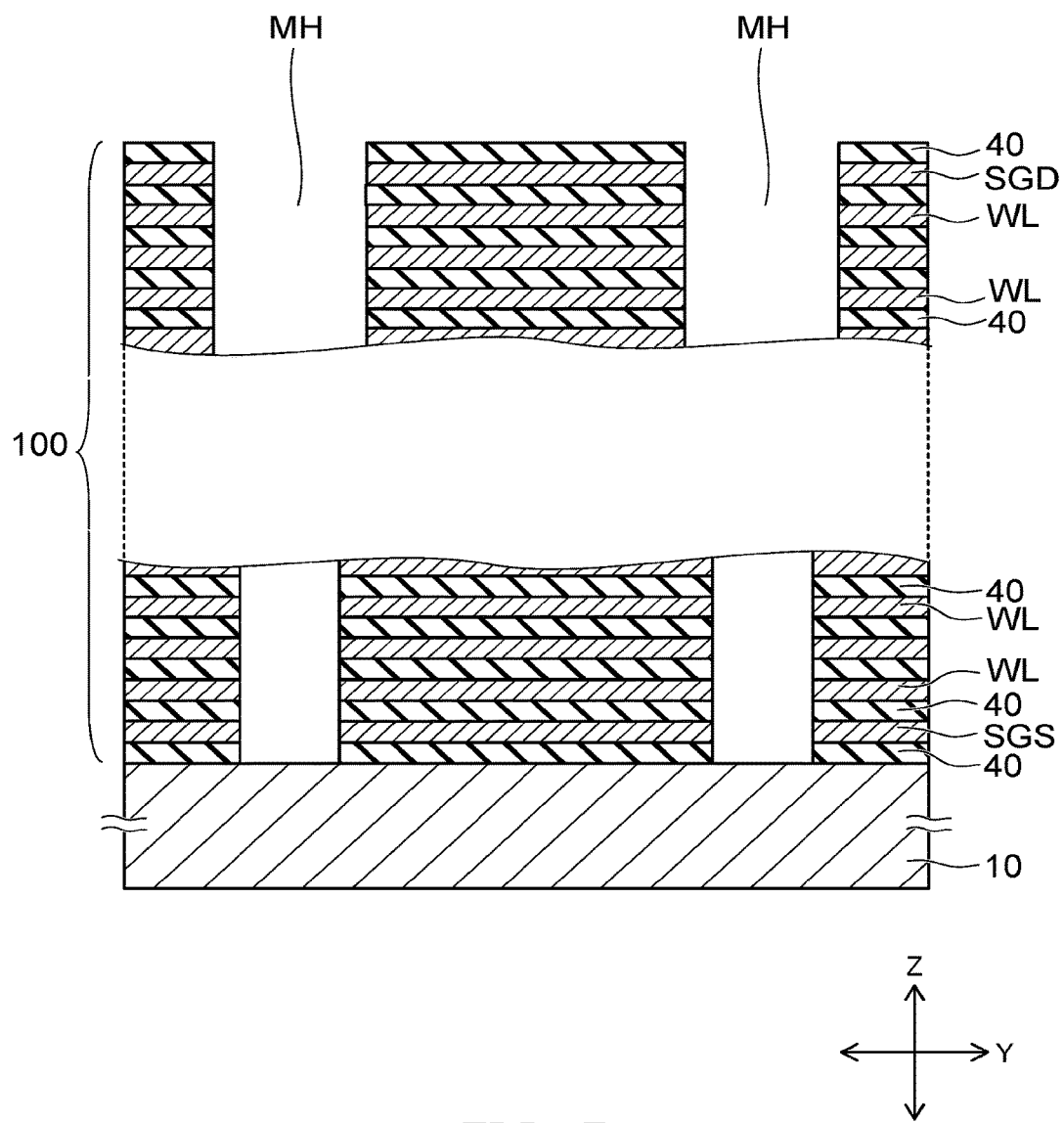

As shown in FIG. 5, the plurality of memory holes MH are formed in the stacked body 100. For example, the memory holes MH are formed by etching the stacked body 100 by a Reactive Ion Etching (RIE) method using a mask (not shown). The bottom of the memory hole MH reaches the substrate 10. The diameter of the memory hole MH on the bottom side is smaller than the diameter on the top side.

Figure 6:
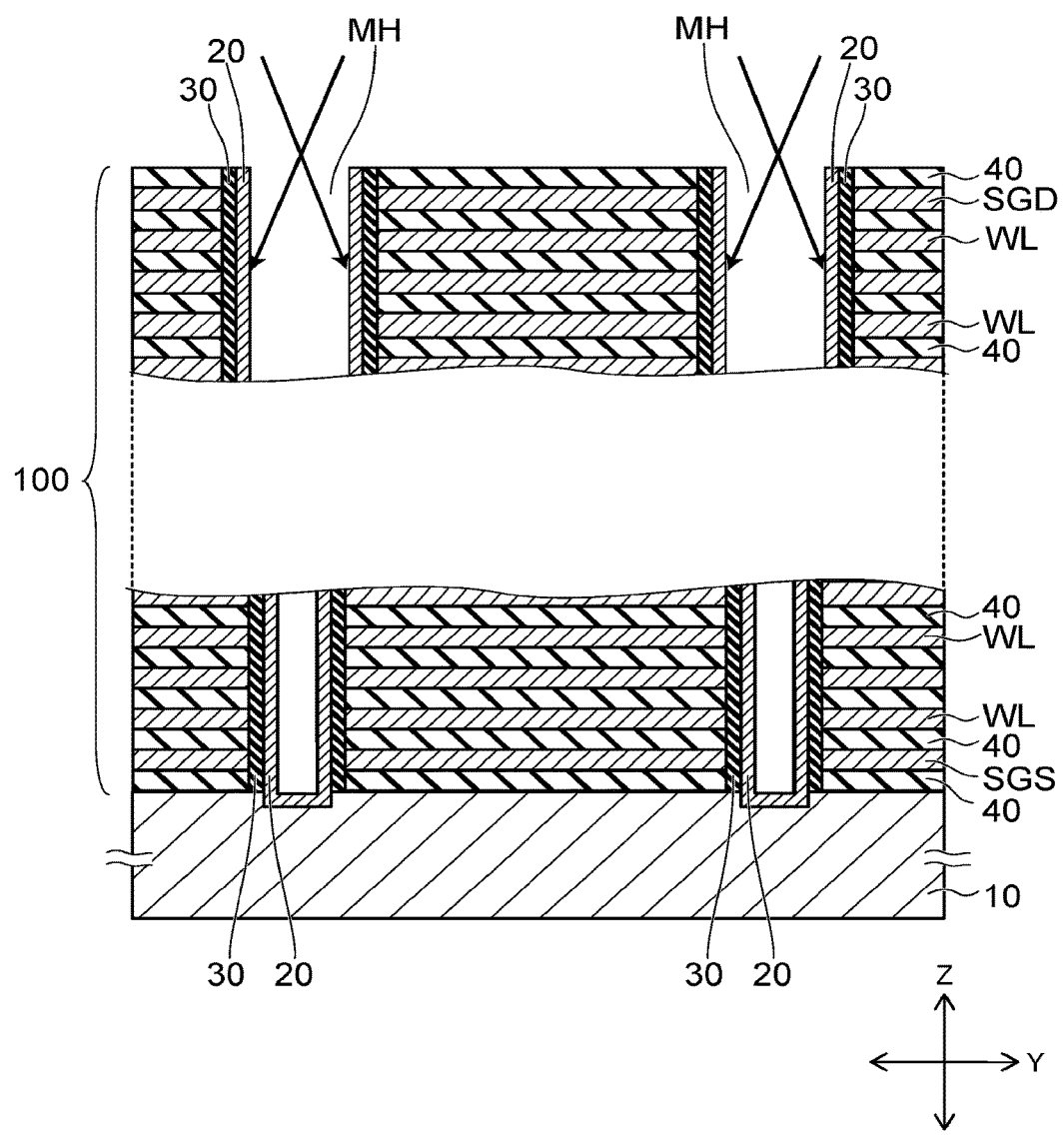

As shown in FIG. 6, the memory film 30 is formed in a pipe shape on a side wall of the memory hole MH. The memory film 30 is also formed at the bottom portion of the memory hole MH. The memory film 30 formed at the bottom portion is removed by, for example, a RIE method.

Thereafter, a semiconductor film 20 is formed on an inner wall of the memory film 30 in a pipe shape. The semiconductor film 20 is, for example, a silicon film. The semiconductor film 20 is also formed at the bottom portion of the memory hole MH and is in contact with the substrate 10. The semiconductor film 20 is formed in a pipe shape, on the inside of which a cavity is left.

After the semiconductor film 20 is formed, an impurity is introduced into a side wall of the semiconductor film 20 of an upper portion of the memory hole MH. For example, boron (B) or boron fluoride ($BF_2$) is implanted into the semiconductor film 20 of the upper portion of the memory hole MH by an ion implantation method.

In this case, as schematically shown by the arrows in FIG. 6, the impurity is implanted into the semiconductor film 20 while being accelerated in directions inclined to the major surface of the substrate 10. The implantation of impurity into the semiconductor film 20 of a lower portion of the memory hole MH is suppressed.

For example, the core insulating film 50 such as a silicon oxide film or a silicon nitride film is buried into the cavity inside the semiconductor film 20.

After the impurity is introduced into the semiconductor film 20 on the upper layer side, a thermal annealing is performed at proper timing, so that the impurity introduced into the semiconductor film 20 is diffused and activated.

The semiconductor body 20*a* on the upper layer side into which the impurity has been introduced has a higher impurity concentration than that of the semiconductor body 20*b* on the lower layer side.

The memory hole MH is formed by collectively etching the plurality of electrode layers WL and the plurality of insulating layers 40. Especially as the number of the electrode layers WL increases and thus the aspect ratio of the memory hole MH increases, the hole diameter is not always the same from the upper layer to the lower layer of the stacked body 100 under the present process technique. In most cases, the hole diameter tends to be large in the upper layer and small in the lower layer.

Hence, the columnar portion CL provided in the memory hole MH is formed in a shape including the upper portion (the first portion CLa) and the lower portion (the second portion CLb) with a smaller diameter than the upper portion.

Since an electric field (tunnel electric field) is hardly applied to the tunnel insulating film 31 of the first portion CLa with a larger diameter than the second portion CLb, the memory cell MC on the upper layer side may have writing failure or erasing failure due to the application of a smaller electric field than a desired electric field.

Figure 7:
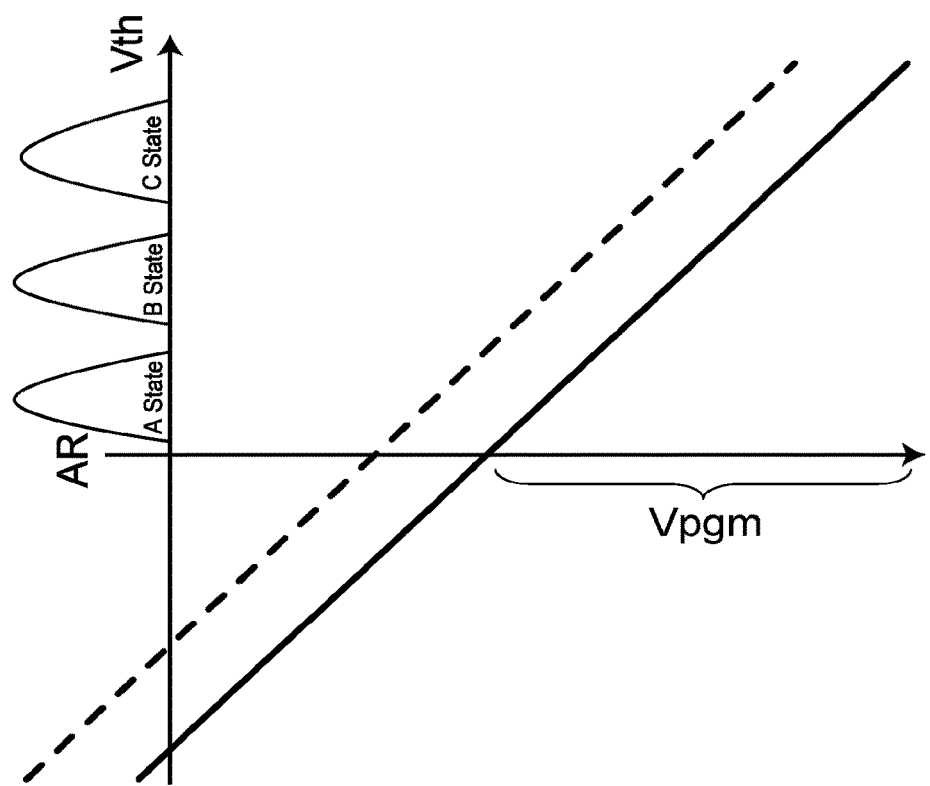
FIG. 7 is a writing characteristic diagram of a memory cell.

FIG. 7 is a writing characteristic diagram of the memory cell.

The horizontal axis shows a voltage to be applied to the electrode layer WL, while the vertical axis shows a threshold voltage Vth of the memory cell. The memory cell can retain, for example, three states, a state A (level A), a state B (level B), and a state C (level C), in ascending order of threshold voltage. AR shows a potential to be used for a reading determination whether the threshold voltage is at the level A or more. Vpgm shows a writing voltage.

When the impurity concentration of the semiconductor body is the same between the upper layer side and the lower layer side (for example, when intrinsic semiconductor is used on both the upper layer side and the lower layer side), the writing speed of the memory cell on the upper layer side where the diameter of the columnar portion CL is large (the characteristic shown by the solid line) is slow compared to the memory cell on the lower layer side where the diameter of the columnar portion is small (the characteristic shown by the broken line).

According to the embodiment described above, since the impurity concentration (carrier concentration) of the semiconductor body 20a on the upper layer side is higher than the impurity concentration (carrier concentration) of the semiconductor body 20b on the lower layer side, a neutral threshold (threshold voltage in a state where charge is not trapped in the charge storage film) of the memory cell on the upper layer side can be shifted to the positive side.

Hence, the writing characteristic of the memory cell on the upper layer side shown by the solid line in FIG. 7 can be close to the writing characteristic of the memory cell on the lower layer side shown by the broken line, so that it is possible to suppress a writing failure on the upper layer side (the first portion CLa) where the diameter of the columnar portion CL is large. That is, it is possible to mitigate a variation in writing characteristic (writing speed) between the memory cell on the upper layer side and the memory cell on the lower layer side.

The upper limit of the threshold voltage of the memory cell on the upper layer side is set such that the memory cell on the upper layer side is turned on with a common read voltage (voltage to be applied to the electrode layer WL of a cell not to be read) Vread. Thus, it is desired that the impurity concentration (for example, boron concentration) of the semiconductor body 20a on the upper layer side is $1\times10^{18}$ cm$^{-3}$ or less.

Figure 8:
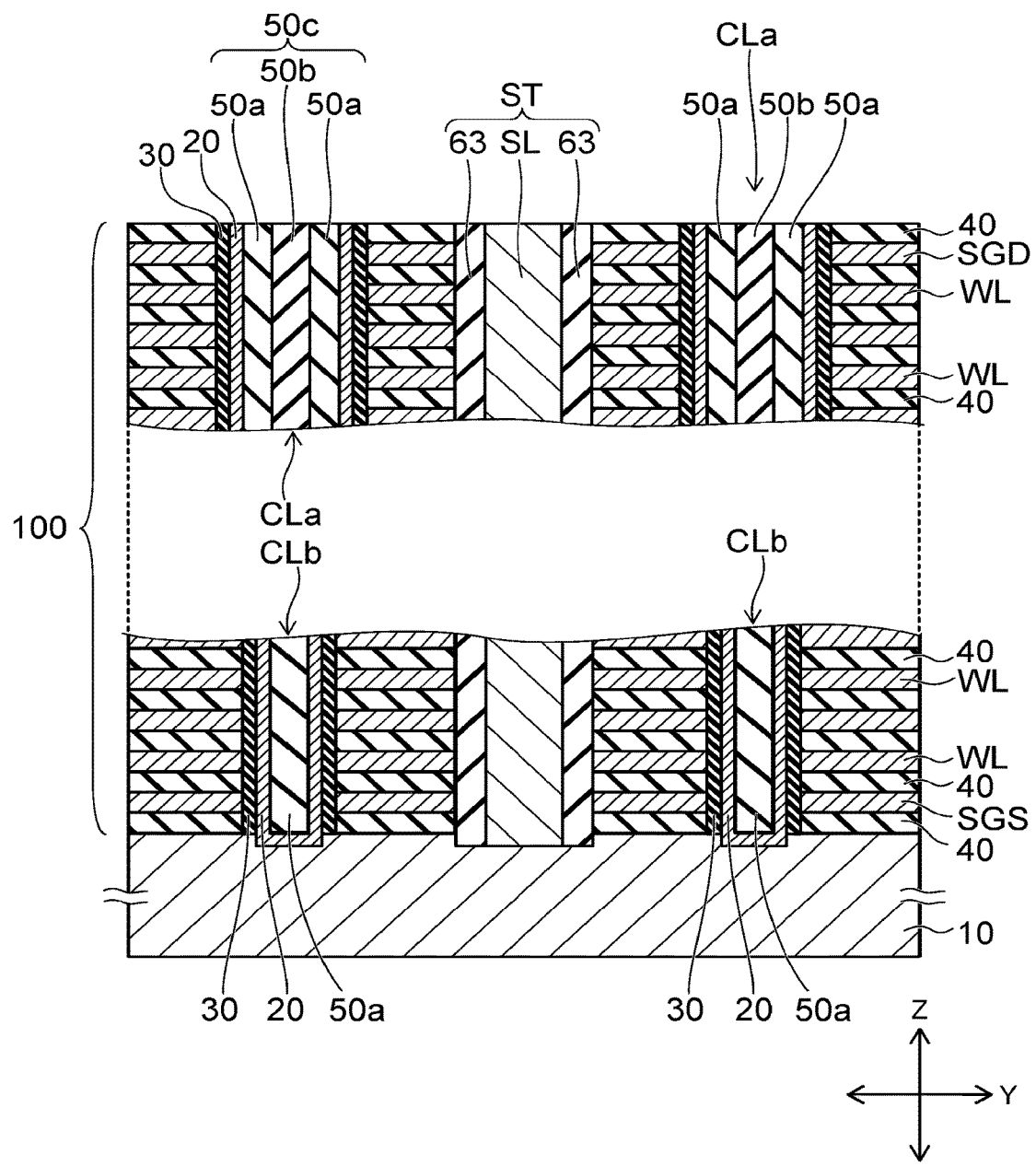
FIG. 8 is a schematic cross-sectional view of a memory cell of a semiconductor device of another embodiment.

Next, FIG. 8 is a schematic cross-sectional view, similar to FIG. 2, of a memory cell array of another embodiment.

In the embodiment, a semiconductor body 20 of the same impurity concentration is provided in the first portion CLa on the upper layer side of the columnar portion CL and in the second portion CLb on the lower layer side. The semiconductor body 20 is an intrinsic semiconductor film, and is, for example, a silicon film. The semiconductor body 20 functions as a channel of the memory cell similarly to the semiconductor bodies 20a and 20b of the embodiment described above.

The first portion CLa of the columnar portion CL includes the memory film 30, the semiconductor body 20, and a core insulating film 50c. The memory film 30 in a pipe shape and the semiconductor body 20 in a pipe shape are provided between the stacked body 100 and the core insulating film 50c. The semiconductor body 20 is provided between the memory film 30 and the core insulating film 50c.

The core insulating film 50c includes a first insulating film 50a and a second insulating film 50b. The first insulating film 50a is provided in a pipe shape inside the semiconductor body 20. The second insulating film 50b is provided inside the first insulating film 50a.

The first insulating film 50a is, for example, a silicon oxide film or a silicon nitride film. The second insulating film 50b contains a metal. The second insulating film 50b contains a metal oxide. For example, the second insulating film 50b contains aluminum oxide ($AlO_2$) as a main component.

The second portion CLb of the columnar portion CL includes the memory film 30, the semiconductor body 20, and the core insulating film 50a. In the second portion CLb, the memory film 30 in a pipe shape and the semiconductor body 20 in a pipe shape are provided between the stacked body 100 and the core insulating film 50a. The semiconductor body 20 is provided between the memory film 30 and the core insulating film 50a.

The core insulating film (third insulating film) 50a of the second portion CLb is, for example, a silicon oxide film or a silicon nitride film, which is the same material as the first insulating film 50a of the core insulating film 50c of the first portion CLa. The core insulating film 50a of the second portion CLb does not substantially contain a metal, and a film containing a metal is not provided inside the core insulating film 50a. The metal concentration of the core insulating film 50c of the first portion CLa is higher than the metal concentration of the core insulating film 50a of the second portion CLb. A single-layer film that does not substantially contain a metal is provided inside the semiconductor body 20 of the second portion CLb.

Aluminum oxide contained in the second insulating film 50b of the core insulating film 50c of the first portion CLa has a negative fixed charge. Due to a back-gate effect caused by the negative fixed charge, the neutral threshold of the memory cell on the upper layer side can be shifted to the positive side. With the increase in the neutral threshold of the memory cell on the upper layer side, it is possible, also in the embodiment shown in FIG. 8, to mitigate a variation in writing characteristic (writing speed) between the memory cell on the upper layer side and the memory cell on the lower layer side.

The structure shown in FIG. 8 can be formed as described below.

After the memory holes MH are formed in the stacked body 100 as shown in FIG. 5, the memory film 30 and the semiconductor body 20 are successively formed on the side wall of the memory hole MH. A cavity is left inside the semiconductor body 20. Since the hole diameter of the memory hole MH is smaller in the lower portion than in the upper portion, the width or diameter of the cavity inside the semiconductor body 20 of the lower portion is smaller than the width or diameter of the cavity inside the semiconductor body 20 of the upper portion.

Then, the core insulating films are formed inside the semiconductor body 20. First, the first insulating film (silicon oxide film or silicon nitride film) 50a is formed inside the semiconductor body 20. In this case, the inside of the semiconductor body 20 of the lower portion is filled with the first insulating film 50a as shown in FIG. 8. In contrast, the inside of the semiconductor body 20 of the upper portion is not filled with the first insulating film 50a, but a cavity is left inside the first insulating film 50a. In the cavity, the second insulating film 50b containing a metal is formed. Since the inside of the semiconductor body 20 of the lower portion is filled with the first insulating film 50a and there is no space for forming the second insulating film 50b, the core insulating film containing a metal is not formed in the lower portion.

Figure 9:
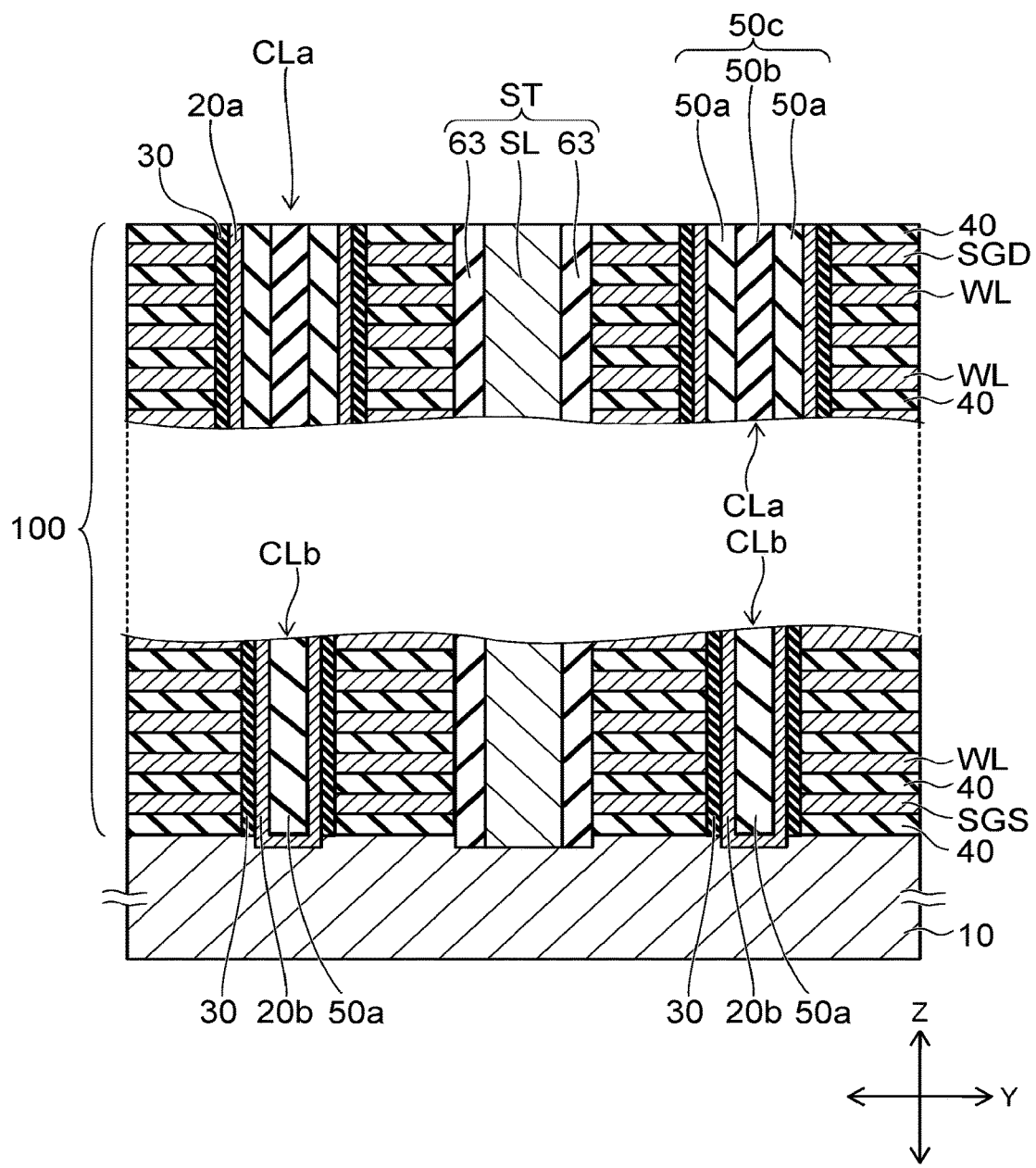
FIG. 9 is a schematic cross-sectional view of a memory cell of a semiconductor device of still another embodiment.

FIG. 9 is a schematic cross-sectional view, similar to FIG. 2, of a memory cell array of still another embodiment.

The embodiment shown in FIG. 9 has a structure obtained by combining the embodiment shown in FIG. 2 and the embodiment shown in FIG. 8 together.

That is, the impurity concentration of the semiconductor body 20a of the first portion CLa of the columnar portion CL is higher than the impurity concentration of the semiconductor body 20b of the second portion CLb. Moreover, the core insulating film 50c of the first portion CLa contains a metal, while the core insulating film 50a of the second portion CLb does not substantially contain a metal. The metal concentration of the core insulating film 50c of the first portion CLa is higher than the metal concentration of the core insulating film 50a of the second portion CLb.

According to the embodiment shown in FIG. 9, the impurity concentration of the semiconductor body 20a on the upper layer side where the diameter of the columnar portion CL is large is made higher than that of the lower layer side, and the core insulating film 50c on the upper layer side contains a metal. Thus, the neutral threshold of the memory cell on the upper layer side can be shifted to the positive side, so that it is possible to mitigate a variation in writing characteristic (writing speed) between the memory cell on the upper layer side and the memory cell on the lower layer side.

According to the embodiments described above, it is possible to mitigate the difference in writing characteristic between the memory cell MC on the upper layer side and the memory cell MC on the lower layer side due to the difference in memory hole diameter (columnar portion diameter), so that the reliability can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
a first memory cell provided in a stacked body including a plurality of electrode layers stacked with an insulator between the electrode layers, the first memory cell including a first electrode layer of the electrode layers, and a first columnar portion with a first diameter, the first columnar portion including a first portion of a semiconductor body extending in the stacked body in a stacking direction of the stacked body, and a first charge storage portion provided between the first portion of the semiconductor body and the first electrode layer; and
a second memory cell provided in the stacked body, the second memory cell including a second electrode layer of the electrode layers, and a second columnar portion with a second diameter smaller than the first diameter, the second columnar portion including a second portion of the semiconductor body and a second charge storage portion provided between the second portion of the semiconductor body and the second electrode layer,
the first portion of the semiconductor body of the first columnar portion of the first memory cell having a higher concentration of an impurity than a concentration of the impurity of the second portion of the semiconductor body of the second columnar portion of the second memory cell, the impurity containing at least one of boron, arsenic, and phosphorus,
the first columnar portion and the second columnar portion further include a core insulating film provided inside the semiconductor body, and
a metal concentration of the core insulating film of the first columnar portion is higher than a metal concentration of the core insulating film of the second columnar portion.

2. The device according to claim 1, wherein a conductivity type of the first portion of the semiconductor body of the first columnar portion is p-type.

3. The device according to claim 1, wherein the first portion of the semiconductor body of the first columnar portion is a silicon film doped with boron.

4. The device according to claim 1, wherein the concentration of the impurity of the first portion of the semiconductor body of the first columnar portion is $1 \times 10^{18}$ cm-3 or less.

5. The device according to claim 1, wherein the second portion of the semiconductor body of the second columnar portion is intrinsic semiconductor.

6. The device according to claim 1, wherein
the core insulating film of the first columnar portion includes
a first insulating film provided on a side wall of the semiconductor body, and
a second insulating film provided inside the first insulating film and containing a metal.

7. The device according to claim 6, wherein the core insulating film of the second columnar portion is a single-layer film of a third insulating film of a same material as the first insulating film.

8. The device according to claim 7, wherein
the first insulating film is a silicon oxide film or a silicon nitride film, and
the third insulating film is a silicon oxide film or a silicon nitride film.

9. The device according to claim 1, wherein
the first columnar portion is provided on an upper side of a central portion in the stacking direction, and
the second columnar portion is provided on a lower side of the central portion in the stacking direction.

10. A semiconductor device comprising:
a stacked body including a plurality of electrode layers stacked with an insulating layer between the electrode layers; and
a columnar portion including a semiconductor body, a charge storage film, and a core insulating film, the semiconductor body extending in the stacked body in a stacking direction of the stacked body, the charge storage film provided between the semiconductor body and the electrode layers, the core insulating film provided inside the semiconductor body, the columnar portion including a first portion with a first diameter and a second portion with a second diameter smaller than the first diameter, the core insulating film of the first portion having a higher metal concentration than a metal concentration of the core insulating film of the second portion.

11. The device according to claim 10, wherein the core insulating film of the first portion contains aluminum.

12. The device according to claim 10, wherein the core insulating film of the first portion contains a metal oxide.

13. The device according to claim 12, wherein the core insulating film of the first portion contains aluminum oxide.

14. The device according to claim 10, wherein the core insulating film of the first portion contains a negative fixed charge.

15. The device according to claim 10, wherein
the core insulating film of the first portion includes
a first insulating film provided on a side wall of the semiconductor body, and
a second insulating film provided inside the first insulating film and containing a metal.

16. The device according to claim 15, wherein the core insulating film of the second portion is a single-layer film of a third insulating film of a same material as the first insulating film.

17. The device according to claim 16, wherein
the first insulating film is a silicon oxide film or a silicon nitride film,
the third insulating film is a silicon oxide film or a silicon nitride film.

18. The device according to claim 10, wherein
the first portion of the columnar portion is provided on an upper side of a central portion in the stacking direction, and
the second portion of the columnar portion is provided on a lower side of the central portion in the stacking direction.

* * * * *